(12) United States Patent
Lozhkin

(10) Patent No.: US 8,749,317 B2
(45) Date of Patent: Jun. 10, 2014

(54) MODULATOR AND AN AMPLIFIER USING THE SAME

(75) Inventor: Alexander N. Lozhkin, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 56 days.

(21) Appl. No.: 13/529,468

(22) Filed: Jun. 21, 2012

(65) Prior Publication Data

US 2013/0049877 A1 Feb. 28, 2013

(30) Foreign Application Priority Data

Aug. 26, 2011 (JP) ................................ 2011-184918

(51) Int. Cl.
*H03C 3/00* (2006.01)
*H03F 3/68* (2006.01)

(52) U.S. Cl.
USPC .......................................... 332/103; 330/126

(58) Field of Classification Search
USPC .......................................... 332/103; 330/126
See application file for complete search history.

(56) References Cited

U.S. PATENT DOCUMENTS

| 6,366,177 B1 * | 4/2002 | McCune et al. ............... 332/103 |
| 7,071,774 B2 * | 7/2006 | Hellberg .................... 330/124 R |
| 2009/0072898 A1 * | 3/2009 | Sorrells et al. ............... 330/127 |
| 2013/0049861 A1 * | 2/2013 | Lozhkin ........................ 330/185 |

FOREIGN PATENT DOCUMENTS

JP 2008-172352 7/2008

OTHER PUBLICATIONS

J. H. Qureshi et al., "A 90-W Peak Power GaN Outphasing Amplifier With Optimum Input Signal Conditioning," IEEE Trans on Microwave Theory and Techniques, 2009, vol. 57, No. 8, pp. 1925-1935.
Ilkka Hakala et al., "A 2.14-GHz Chireix Outphasing Transmitter," IEEE Trans on Microwave Theory and Techniques, Jun. 2005, vol. 53, No. 6, pp. 2129-2138.
W. C. Edmund Neo et al., "A Mixed Signal Approach Towards Linear and Efficient $N$-Way Doherty Amplifiers," IEEE Trans on Microwave Theory and Techniques, May 2007, vol. 55, No. 5, pp. 866-879.
Paloma Garcia et al., "Adaptive digital correction of gain and phase imbalances in LINC transmitters," IEEE Trans, 2004, vol. 3, pp. 2137-2141.

* cited by examiner

*Primary Examiner* — Joseph Chang
(74) *Attorney, Agent, or Firm* — Fujitsu Patent Center

(57) ABSTRACT

The LINC modulator includes: a separator that generates a plurality of constant envelope signals from a source signal; a plurality of arms through which the plurality of the constant envelope signals are passed, wherein each arm includes a filter that compares frequencies of components of the constant envelope signals with a threshold frequency to generate a first signal including a first frequency part of the source signal, the first frequency part being composed of frequencies lower than a predetermined frequency; a processor that generates a second signal including a second frequency part of the source signal whose frequencies are different from the first frequency part and performs a frequency signal distortion of the second signal to generate a distorted signal; and a quadrature modulator that multiplies the first and distorted signals to reconstruct the constant envelope signals.

15 Claims, 9 Drawing Sheets

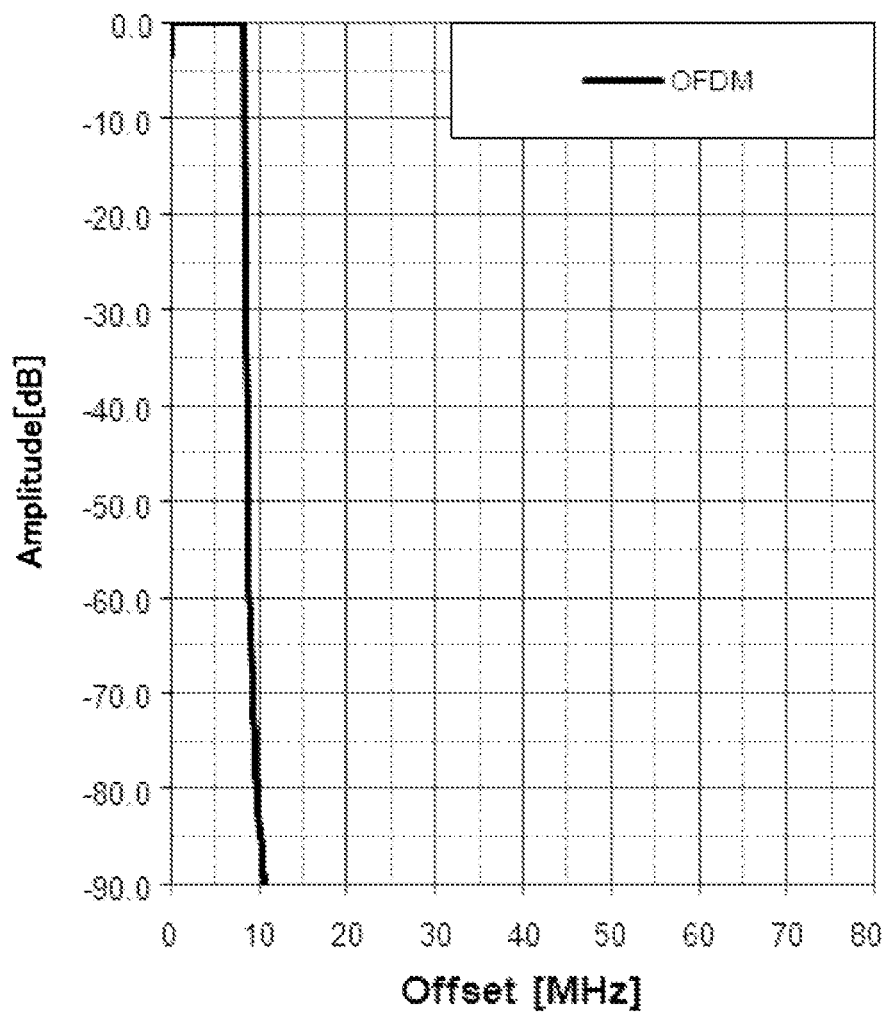
F I G. 2

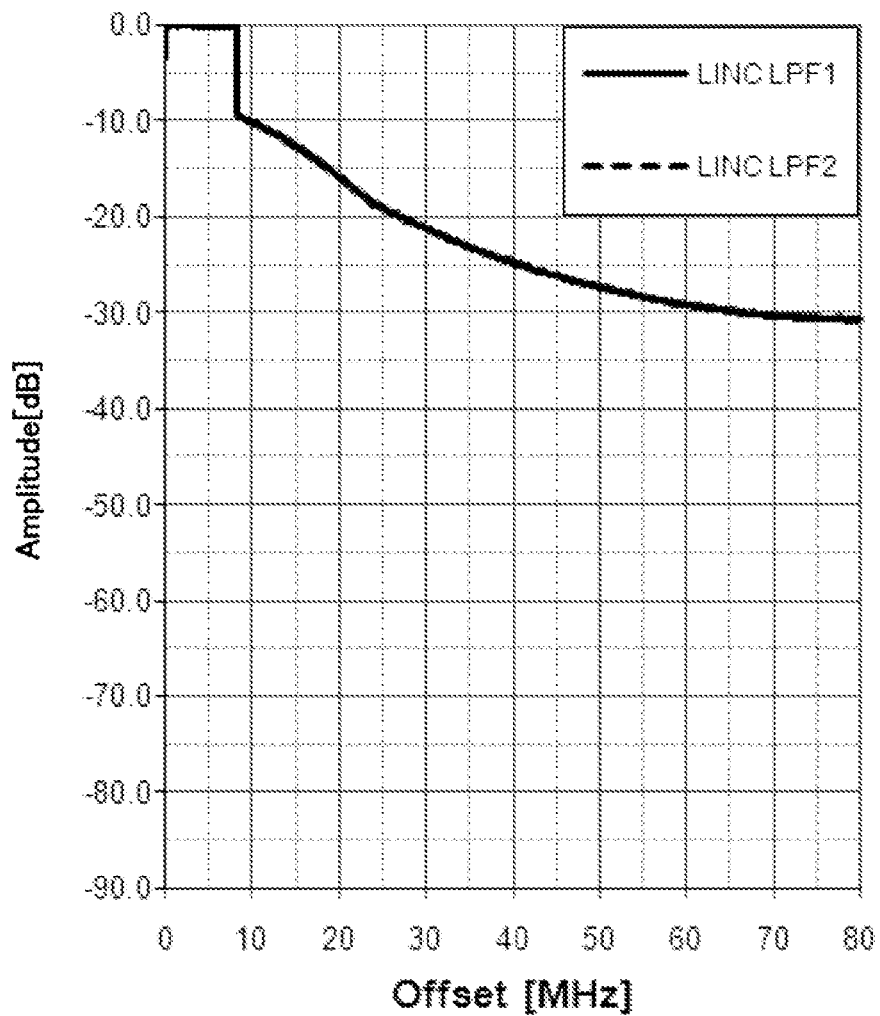
F I G. 3

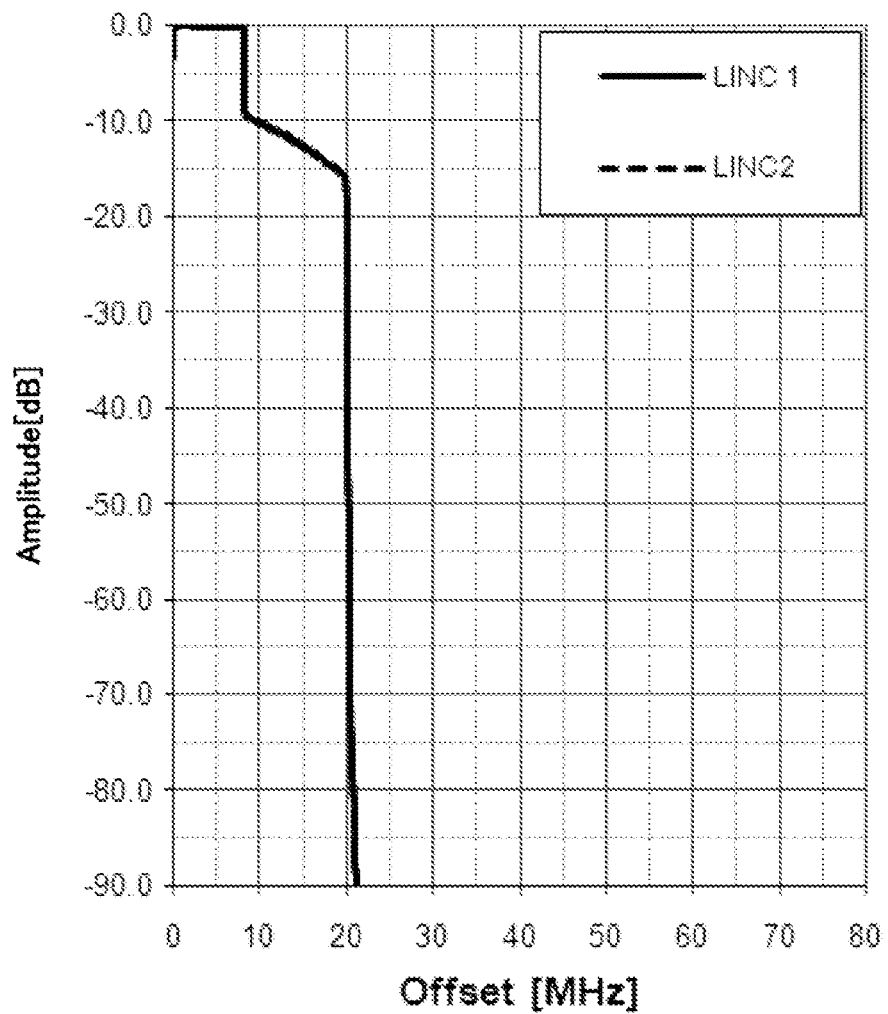
F I G. 4

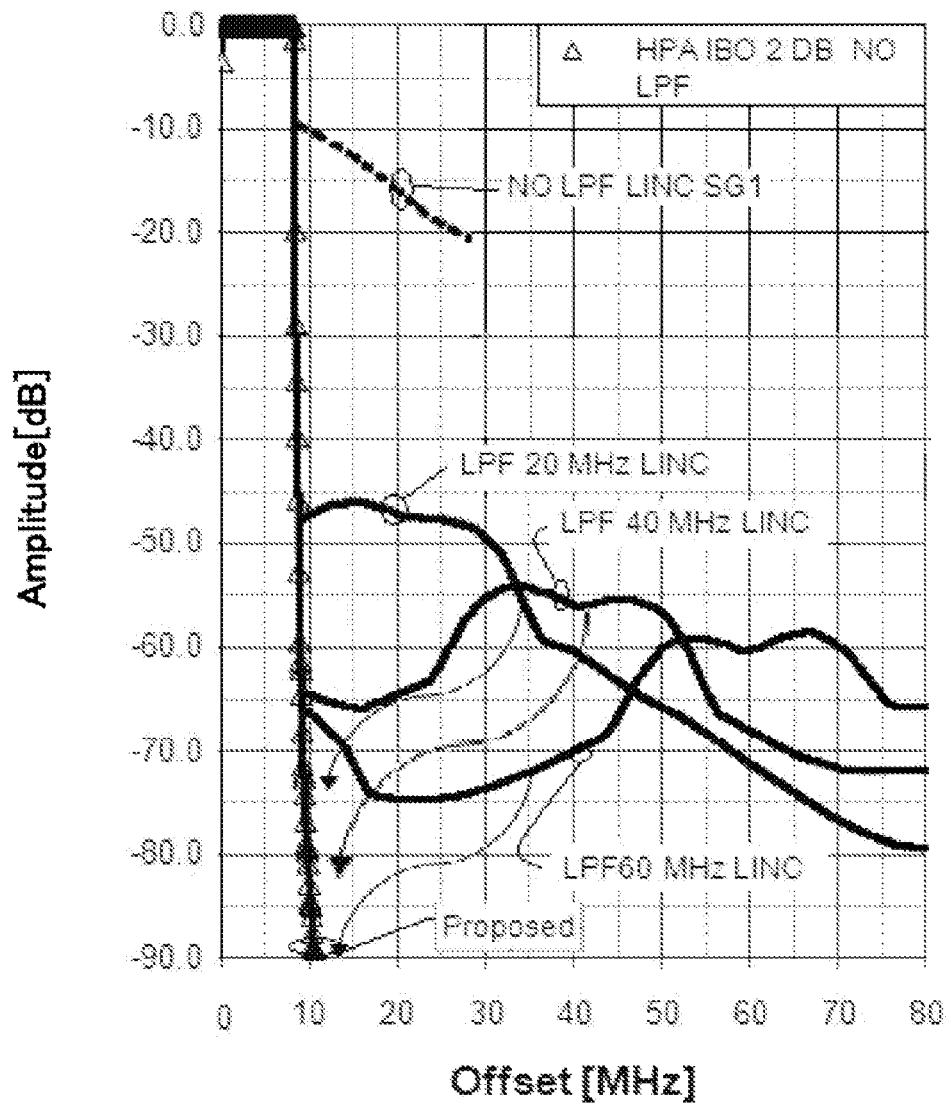
F I G. 9

MODULATOR AND AN AMPLIFIER USING THE SAME

CROSS-REFERENCE TO RELATED APPLICATIONS

This application is based upon and claims the benefit of priority of the prior Japanese Patent Application No. 2011-184918 filed on Aug. 26, 2011, the entire contents of which are incorporated herein by reference.

FIELD

This invention relates to a modulator and a high power amplifier using the same.

BACKGROUND

There is a high interest in wireless communication to develop highly linear and efficient power amplifier suitable for third generation (3G) and upcoming fourth generation (4G) of communication standards. These new standards have potential for offering more and better data services. However, in order to establish the highly linear and efficient power amplifier within a restricted frequency band, it is needed to use signals with high peak-to-average power ratios (e.g., wideband code division multiple access (WCDMA)~10 dB), requiring high linearity of the transmitting amplifier. Hence, in general, power amplifiers are designed to be subjected to the peak-power condition, but are operated most of the time at sufficiently lower power levels (power peak-off). As a result, the power amplifier operating with these signals may function such that the peak efficiency is high, but the average amplifier efficiency is rather low.

For this reason, there is a renewed interest in high efficiency power amplifiers, for example the Doherty power amplifier (DPA), linear amplification using nonlinear components (LINC), envelope tracking (ET) and the like. These types of the amplifiers are currently investigated as potential candidates suitable for the current and above-mentioned upcoming communication standards. In such a radio frequency (RF) amplifier demands more high efficiency and high linearity than general RF amplifier. Specifically, due to its improved efficiency, low complexity, and low cost, the two-way DPA has already penetrated the market. The DPA is, in general, high efficiency than general balanced amplifier. Although a general designs focus only amplitude distortions and phase distortions, a memory effect and linearity become very important factors recently. Such a general structure of the DPA has a weak point which leads high distortion such as third and fifth inter-modulation distortions (IMDs). For example, the distortion results from a sudden variation of impedance at signal synthesized point. To reduce the distortion by structure of the DPA, it demands complex compensator. The memory effect includes electric memory effect and electrothermal memory effect. The electric memory effect is occurred by bias and matching circuit's impedance variation in base and harmonic band. The electrothermal memory effect is FET power amplifier's gain variation by device temperature. The electrothermal memory effect is inevitable factor.

Therefore, proper compensator structures, such as the composite high power amplifier (C-HPA) have been introduced to increase the efficiency and output power. Such C-HPA comprises several individual high power amplifiers (HPAs). Most common configuration is C-HPA with two HPAs which also known as a LInear amplification using Nonlinear Components (LINC).

The LINC technique was first proposed in 1974 as a method of achieving linear amplification at microwave frequencies. The basic scheme of LINC for amplifier has two RF HPAs that are assumed to be high-efficiency and highly non-linear. The RF source signal x(t) is split into two constant envelope, phase modulated signals, x1(t), x2(t) by signal component separator (SCS) that has a function of the signal separation or generation process, and each is fed into its own nonlinear RF power amplifier. The HPAs separately increase the power of each signal to generate output signals y1(t) and y2(t) before feeding them into a summing junction for recombination. The resulting output signal from the summing junction is then an amplified version of the original input signal without any distortion, if all components constituting the HPA are ideal ones.

In many issues it is assumed that the bandwidth at the digital-to-analog convertor (DAC) output is unlimited. However for many cases such an assumption is not applicable. Normally DACs have the low-pass filter (LPF) at its output. Such LPFs introduce some parasitic amplitude modulation (AM) into the DAC output signal. With such parasitic AM and non-linear HPA the complete transmitted signal reconstruction is not possible. Thus the out-of-band spectrum components are arising in the HPA output signal spectrum.

Despite the original signal x(t) has a narrow spectrum, the signal component separating (SCS) operation causes a significant spectrum expansion for signals x1(t) and x2(t) in the C-HPA arms. In the conventional technique disclosed in, for example, patent document 1 and non-patent documents 1-4 cited above, it is assumed the ideal arms with unlimited bandwidth (i.e. ultra-wideband ideal DACs) that may pass wideband signals x1(t) and x2(t) without any distortions to inputs to the HPAs (hereinafter, sometimes to be referred to as HPA1 and HPA2). The most critical element in the arm may be DAC because its bandwidth is limited by operating clock. Typically this is 100-150 MHz for low/mid-ends commercial available Large Scale Integrations (LSIs). In contrast, DACs for the broadband applications such as Worldwide interoperability for Microwave Access (WiMAX), Long Term Evoluation (LTE), Wideband Code Division Multiple Access (W-CDMA) and the like, in order to avoid distortions in signals $x_1(t)$ and $x_2(t)$, must provide very high bandwidth (must operate with high clock frequencies in order several hundred MHz) and at the same time provide a high level of bit resolution (quantization), for example, 800 MHz clock and 14 bit resolution. The cost for such a hi-speed and hi-resolution hi-end DACs is high.

The frequency restrictions caused by component of a high frequency circuit such as LPFs at the DACs inputs (or DAC outputs) result in the parasitic AM at the HAP1 and HAP2 inputs for signals $x_1(t)$ and $x_2(t)$. The LPFs cut some high frequency part of signals $x_1(t)$ and $x_2(t)$. The high frequency part that cut by LPF causes the unwanted parasitic AM modulation in signals at the LPF output. Such parasitic AM results in growth of out-of-band spectrum components after combining signals $y_1$ and $y_2$. In general, the perfect signal reconstruction after combining signals passed through LPFs becomes difficult.

The problem arises when RF signal is amplified with the C-HPA that comprises two or more individual arms, each of the arms has high power amplifier (HPA) having the bandwidth restriction. Such frequency restriction may be attributed to frequency characteristics of LPF, low-speed DAC, and/or narrow-band quadrature modulators.

One of the aims of the present invention is to provide a modulator that removes parasitic amplitude modulation automatically, thereby reconstructing a signal inputted into the modulator at an output terminal of the LINC modulator.

Another of the aims of the present invention is to provide am amplifier having a modulator that removes parasitic amplitude modulation automatically, thereby reconstructing a signal inputted into the modulator at an output terminal of the LINC modulator.

SUMMARY

A linear amplification with nonlinear components (LINC) modulator is provided. The LINC modulator includes: The modulator includes: a separator that generates a plurality of constant envelope signals from a source signal; a plurality of arms through which the plurality of the constant envelope signals are passed, wherein each arm includes a filter that compares frequencies of components of the constant envelope signals with a threshold frequency to generate a first signal including a first frequency part of the input signal, the first frequency part being composed of frequencies lower than a predetermined frequency; a processor (400a, 400b) that generates and a second signal including a second frequency part of the input signal whose frequencies are different from the first frequency part of the first signal and performs a frequency signal distortion of the second signal to generate a distorted signal, the frequency signal distortion being defined using the first signal and the second signal; and a quadrature modulator that multiplies the first signal and the distorted signal to reconstruct the constant envelope signals.

The object and advatages of the invention will be realized and attained by means of the elements and combinations particularly pointed out in the claims.

It is to be understood that both the foregoing general description and the following detailed description are exemplary and explanatory and are not restricted of the invention, as claimed.

BRIEF DESCRIPTION OF DRAWINGS

FIG. 2 is a diagram illustrating the spectrum of an input signal x(t) of C-HPA;

FIG. 3 is a diagram illustrating the spectrums signals in the C-HPA arms ($x_1$ and $x_2$) after signal component separator (SCS);

FIG. 4 is a diagram illustrating the spectrums for signal in the C-HPA arms at the LPFs outputs;

FIG. 9 is a diagram illustrating the C-HPA output signal spectrum for the narrowband linear LINC modulator for LPFs in the arms with passband 20 MHz, 40 MHz and 60 MHz.

DESCRIPTION OF EMBODIMENTS

Figure 1:
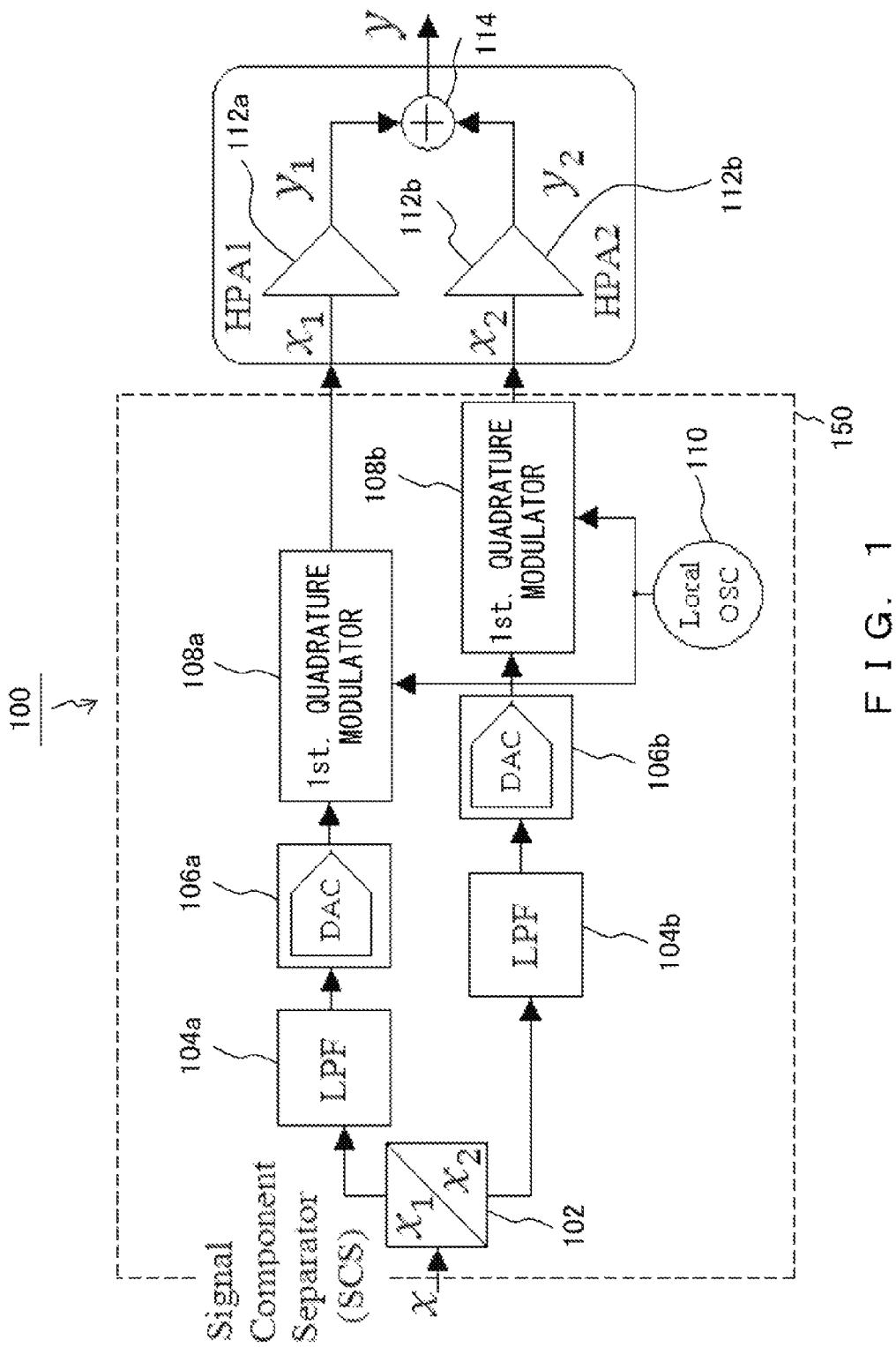
FIG. 1 is a functional diagram illustrating an exemplary C-HPA with the frequency restriction in the C-HPA arms and combined output signal y(t) from the individual HPAs.

With referring to the drawings, the detailed description of the present invention will be provided. In the drawings, like numerals may describe similar components in different views. Like numerals having different letter suffixes may represent different instances of similar components. The drawings illustrate generally, by the way of example, but not by the way of limitation, various embodiments discussed in the present document.

COMPARATIVE EXAMPLE

At first, comparative example of composite High Power Amplifier (C-HPA) will be explained to make understanding of technical features of the preferred embodiments according to the present invention easier.

FIG. 1 is a functional diagram illustrating an example of composite High Power Amplifier (C-HPA) 100. The C-HPA 100 may be suffered from the frequency restriction in each of the C-HPA arms and generate an output signal y(t) that is obtained in the manner in which signals from the individual high power amplifiers (HPAs) are combined.

The C-HPA 100 illustrated in FIG. 1 includes several components of a high frequency circuit. The components includes a signal component separator (SCS) 102, two low pass filters (LPFs) (sometimes simply referred to as a filter) 104a and 104b, two digital-to-analog convertors (DACs) 106a and 106b, two first quadrature modulators (or sometimes referred to as two quadrature modulators for simplicity) 108a and 108b, a local oscillator 110, a first high power amplifier ($HPA_1$) 112a, a second high power amplifier ($HPA_2$) 112b, and combiner 114. The SCS 102, the LPFs 104a, 104b, the DACs 106a, 106b, the first quadrature modulators 108a, 108b, and the local oscillator 110 constitutes a LInear amplification using Nonlinear Components (LINC) modulator 150.

The SCS 102 generates two constant-envelope signals, i.e., a first constant-envelope signal $x_1(t)$ and a second constant-envelope signal x2(t) using a source signal x(t), i.e., a baseband source signal x(t). In other words, the source signal x(t) is separated into the two constant envelope signals $x_1(t)$ and $x_2(t)$ by the SCS 102. If the source signal x(t) may be written as $$x(t)=c(t)e^{\sqrt{-1}\phi(t)}, 0 \leq c(t) \leq c_{max}. \quad (1)$$

Wherein two constant envelope signals x1(t) and x2(t) may be calculated as $$x_1(t) = \frac{x(t)}{2}(1-e(t)) = \frac{1}{2}c_m\cos[\varphi(t) - \Psi(t)], \quad (2)$$

$$x_2(t) = \frac{x(t)}{2}(1+e(t)) = \frac{1}{2}c_m\cos[\varphi(t) + \Psi(t)], \quad (3)$$

where $$\Psi(t)=\cos^{-1}[c(t)/c_m],$$

and e(t) is a signal that is in quadrature to the source signal x(t):

$$e(t) = \sqrt{-1}\,x(t) \times \sqrt{\frac{c_{max}^2}{|c(t)|^2} - 1}. \quad (4)$$

Thus, $x(t)=x_1(t)+x_2(t)$ and $|x_1(t)|=|x_2(t)|$, where |x| represents an absolute value of x. It should be noted that $x_1(t)$ and $x_2(t)$ have constant amplitudes that are time-independent, while the source signal $x(t)$ has a time-dependent amplitude.

FIG. 2 illustrates the spectrum of the source signal $x(t)$ in equation (1). It may be seen that the source signal $x(t)$ has a narrow spectrum. However, the signal component separating operation causes a significant spectrum expansion for signals $x_1(t)$ and $x_2(t)$ at as illustrated in FIG. 3.

The LPFs 104a and 104b remove frequency components higher than a predetermined sampling frequency and noise components from each of output signals $x_1(t)$ and $x_2(t)$ from the SCS 102, respectively. In other words, the LPFs 104a and 104b pass frequency components lower then the predetermined frequency only.

Spectrums for signals at the LPF output (or what is the same at the inputs of the HPA1 112a and the HPA$_2$ 112b) are illustrated in FIG. 4, illustrating a fact that LPFs 104a and 104b may remove frequency components higher than 10 MHz from the output signals $x_1(t)$ and $x_2(t)$ from the SCS 102. The high frequency part that cut by LPF causes the unwanted parasitic AM modulation in signals at the output terminal of LPF 104a, 104b.

The DACs 106a and 106b convert output signals from the LPF 104a and the LPF 104b from a digital to analog signal, respectively.

The local oscillator 110 is an oscillation circuit such as a frequency combiner or the like employing a voltage controlled oscillator that may be controlled by a phase-locked loop (PLL). The local oscillator 110 outputs a local oscillation signal to the first quadrature modulators 108a and 108b.

The first quadrature modulator 108a includes mixer for frequency-converting (up-converting) frequencies and mixing the output signal from the DAC 106a with the local oscillation signal from the local oscillator 110. Thus, the first quadrature modulator 108a serves as a multiplier that multiples input signals to generate an output signal. After mixing, the first quadrature modulator 108a up-converts the output signal from the DAC 106a to predetermined frequency. Ideally, the first quadrature modulator 108a generates and outputs the constant envelope signal $x_1(t)$.

The first quadrature modulator 108b has the similar configuration and function with the first quadrature modulator 108a. Ideally, the first quadrature modulator 108b generates and outputs the constant envelope signal $x_2(t)$.

The first high power amplifier (HPA$_1$) 112a amplifies the output signal from the quadrature modulator 108a and outputs an amplified signal to the combiner 114. Similarly, the second high power amplifier (HPA$_2$) 112b amplifies the output signal from the first quadrature modulator 108b and outputs an amplified signal to the combiner 114.

The first quadrature modulator 108a, 108b of each arm may be characterized by a level-dependent complex gain G. Thus, output signals $y_1(t)$ and $y_2(t)$ should be given by $$y_1(t)=x_1(t) \cdot G_1(|x_1(t)|), \quad (5)$$

$$y_2(t)=x_2(t) \cdot G_2(|x_2(t)|). \quad (6)$$

The combiner 114 combines the input signals thereto, in this case the signals from the HPA1 112a and HPA2 112b to generate an output signal $y(t)$ from the amplifier 100. In this case, the output signal $y(t)$ becomes $$y(t) = y_1(t) + y_2(t) = \quad (7)$$
$$x(t)\frac{G_1(|x_1(t)|) + G_2(|x_1(t)|)}{2} + e(t)\frac{G_1(|x_1(t)|) - G_2(|x_1(t)|)}{2}.$$

The second term in (7) implies that there in an unwanted residual signal when the gain and phase matching are not perfected, i.e., imperfect maycellation is occurred. This term leads to limit the spectrum efficiency due to interfering power in the adjacent arms.

Figure 5:
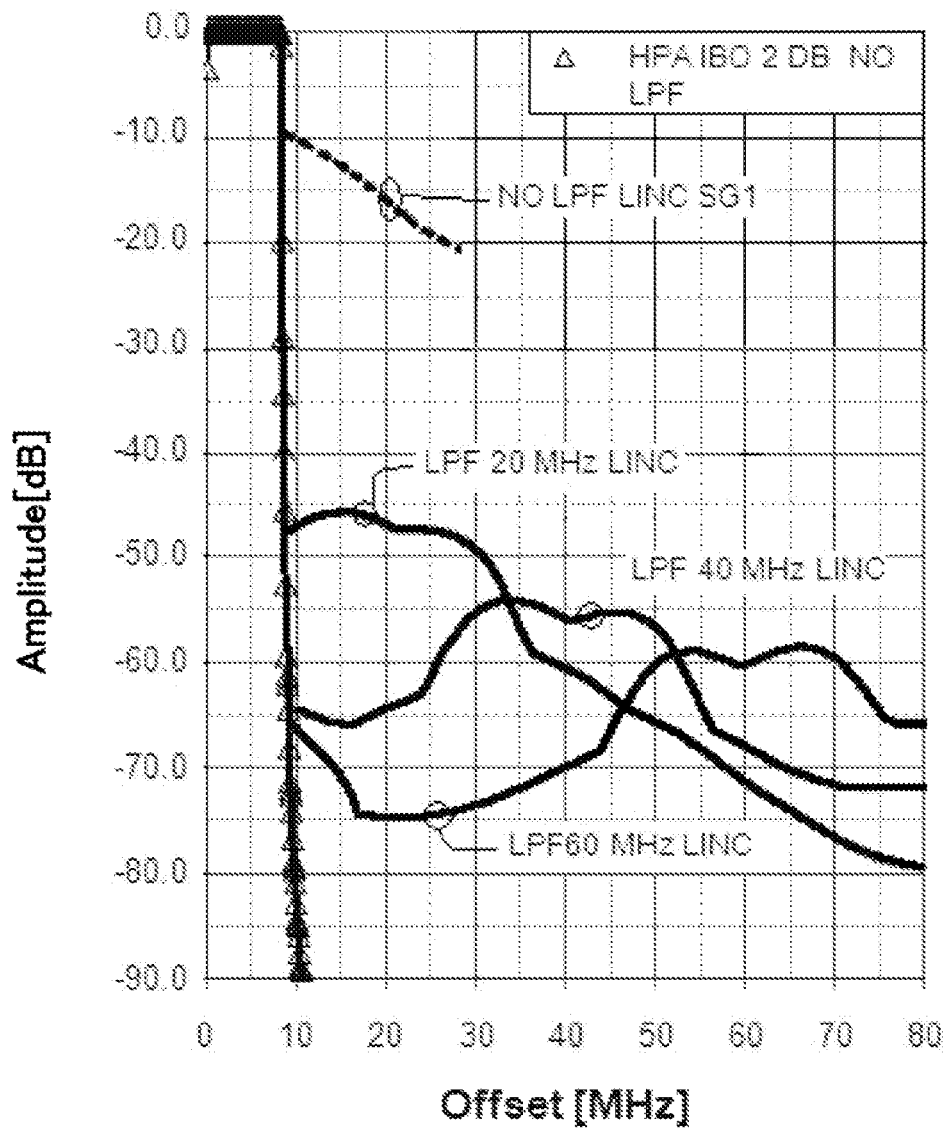
FIG. 5 is a diagram illustrating the C-HPA output signal spectrum (spectrum for signal y) for LPFs in the arms with passband 20 MHz, 40 MHz and 60 MHz.

It may be occurred that the parasitic amplitude modulation (AM) results in growth of out-of-band spectrum components after combining signals $y_1$ and $y_2$. FIG. 5 illustrates the spectrums of the LINC HPA output signal for 10 MHz orthogonal frequency-division multiplexing (OFDM) signal $x(t)$. As may be found from FIG. 5, the LINC C-HPA signal after combining has a higher level of the out-of-band spectrum components compared with the original signal $x(t)$.

(Basic Operations)

Before describing the preferred embodiment, the basic operations of a narrowband linear LINC modulator will be explained below.

One of the aims of the technique according to the present embodiment is to reduce the unwanted factor:

$$G_1(|x_1(t)|) - G_2(|x_1(t)|)$$

in the right hand side of the equation (7).

Figure 6:
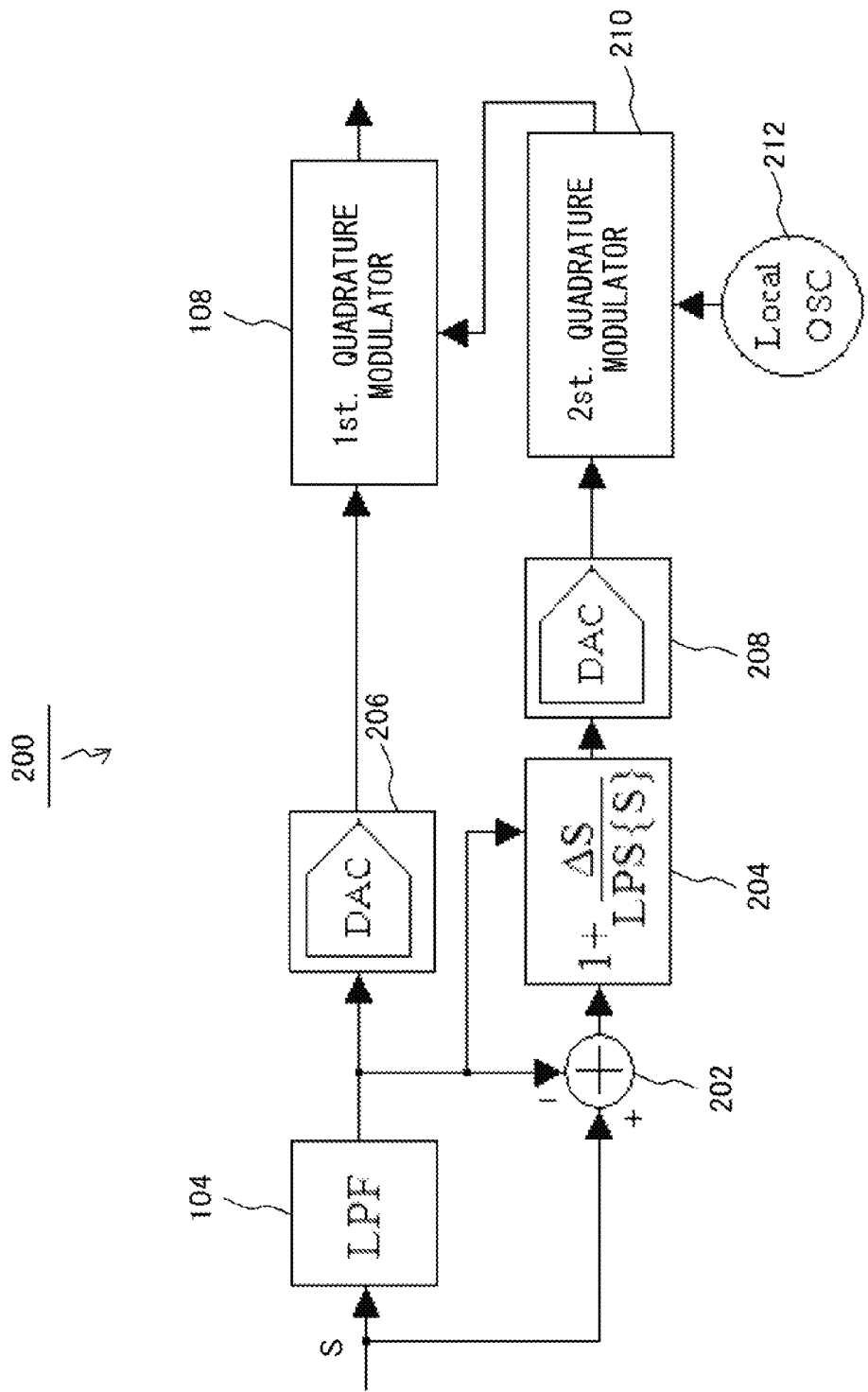
FIG. 6 is a functional diagram illustrating the single arm for a linear amplification using nonlinear components (LINC) modulator.

FIG. 6 is a functional diagram illustrating the single arm for a linear amplification using nonlinear components (LINC) modulator 200. The components having the same or similar functions with those of the components illustrated in FIG. 1 will have the same or similar reference numerals and the detailed explanations thereof will be omitted.

The single arm of the LINC modulator illustrated in FIG. 6 may be utilized in a LINC amplifier having High Power Amplifiers (HPAs). Here, it is considered the simplest case of the multi-arm composite high power amplifiers, that is, the LINC amplifier, when the source signal S(t) to be transmitted is split into two or more constant-envelope signals in the Signal Component Separator (SCS) as illustrated in FIG. 1. These constant-envelope signals are amplified by individual arm of the HPAs with the common load where these amplified signals would be combined at the combiner. In order to reconstruct the source signal S(t) at the output terminal of the first quadrature modulator 108, circuits in the C-HPA arms may not introduce any frequency distortions for constant-envelope signals.

The LINC modulator 200 is designed to reduce the bandwidth requirements for the circuits in the arm. The digital-to-analog convertor (DAC) circuit requirements also may be relaxed. Thus, the conversion speed (clock) and the resolution requirements (bit resolutions) for the DACs in the arms of the LINC modulator 200 may be reduced sequentially. Therefore the low-cost DACs may be implemented in the LINC C-HPA instead of costly high grade LSIs. At the same time, the level of the out-of-the band spectrum at the C-HPA output after combining is maintained low. Thus this embodiment may provide the perfect reconstruction signal at the C-HPA output in the case of the frequency restriction in the arms.

As illustrated in FIG. 6, a single arm of the LINC modulator 200 includes the LPF 104, a first digital-to-analog convertor (DAC) 206, a first quadrature modulator (or sometimes referred to as a quadrature modulator for simplicity) 108, a subtractor 202, a processor 204, a second DAC 208, a second quadrature modulator 210, and a local oscillator 212.

As it may be seen in FIG. 6, a source signal S(t) that may represents a first constant-envelope signal x1(t) or a second constant-envelope signal x2(t) in the case illustrated in FIG. 1 is further separated into two parts, i.e., a low-frequency part which does not include high frequency component of constant-envelope signal and a high frequency part whose frequency components are different from those of the low-frequency part after the source signal S is passed through the LPS 104. It should be noted that the output signal from the LPF 104 has frequency components lower than a threshold frequency. These components may be considered to substantially have a continuous spectrum. The signal distortions due to frequency restriction influence the high-frequency part (the high frequency components) only. The distorted signal which is a signal including the high-frequency components may be responsible for the unwanted parasitic AM. The high frequency part ΔS(t) for the arm illustrated in FIG. 6 is generated as the difference (the error) between the original signal S(t) in the arm and the signal LPF{S} with frequency restriction at the LPF outputs:

$$\Delta S = S - LPF\{S\}. \quad (8)$$

That is, the high frequency part ΔS(t) is linearly separated from the source signal S. As illustrated in FIG. 6, the low-frequency part LPF{S} of the source signal S(t) is passing directly to the DAC 206. Because its low-frequency nature, it is possible to implement a low-frequency and high-resolution (e.g., 14 bit) DAC as the DAC 206.

In order to perfectly reconstruct signal S(t) after combining, the signals distortion (the high-frequency part) ΔS for the arm is also have to be proceeded.

The signals distortion (the high-frequency part) ΔS is used to generate a signal ΔS':

$$\Delta S' = 1 + \frac{\Delta S}{LPF\{S\}}. \quad (9)$$

If the filtered signal LPF{S} the distorted signal ΔS' may be suitably combined, it may be possible to reconstruct the source signal S(t) perfectly because multiplication of LPF{S} and ΔS' results in S(t)=LPF{S}+ΔS.

In general, the signals distortion ΔS has the amplitude level less than −35 dB with respect to the main signal LPF{S} at the LPF outputs as illustrated in FIG. 4. Therefore the DAC 208 with low number of quantization level (bit resolution) may be used for generation such low-level signals. The signal level 35 dB is corresponding to 6 bit resolution. Thus the DAC 208 with only 8 bits (14−6=8 bit) may be able to generate signals distortion: ΔS=S−LPF{S}.

Here, with referring to FIG. 6, the basic operation of the single arm for C-HPA will be explained.

The first DAC 206 may be a low-speed and high-resolution (e.g., 14 bit) DAC, while the second DAC 208 may be a high-speed and low resolution (e.g., 8 bit) DAC.

The first quadrature modulator 108 up-converts frequencies and mixes output signal from the DAC 206 with the output signal from the second quadrature modulator 210. The first quadrature modulator 108 may have the same or similar configuration and function with the first quadrature modulators 108a, 108b.

The first and second quadrature modulators 108 and 210 multiplies a signal at one input terminal referred to as, for example, a baseband input terminal with a RF signal at another input terminal, referred to as, for example, a LO input terminal.

The subtractor 202 may receive two signals, i.e., the source signal S and the output signal from the LPF 104 LPF{S}, and subtracts the output signal from the LPF 104 LPF{S} from the source signal S to output a resulting signal ΔS=S−LPF{S}. The output signal form the subtractor 202 may be inputted into the processor 204.

The processor 204 receives the output signal from the LPF 104 LPF{S} in addition to the output signal from the subtractor 202. The processor 204 may perform the calculation to generate and output a signal ΔS' defined by the above equation (9). The equation (9) will be derived below. Here, it should be recognized that signal ΔS' represents the modified version of the signal distortion ΔS. The output signal ΔS' from the processor 204 may be processed to be converted from digital to analog signal at the DAC 208. The output signal from the DAC 208 is input into the second quadrature modulator 210. At the second quadrature modulator 210, frequencies of the output signal from the DAC 208 may be up-converted and mixed with the output signal from a signal from the local oscillator 212 to generate a resulting signal to be input into the first quadrature modulator 108. That is, before to be applied to the C-HPA arms quadrature modulator, the local oscillator (LO) signal is modulated by signal ΔS'.

Here, deviation of equation (9) will be explained.

The source signal S may be divided into two parts using the LPF 104:

$$S = \Delta S + LPF\{S\}. \quad (10)$$

Equation (10) simply means that after passing through the LPF 104, the source signal S may be divided into a passed part LPF{S} and a cut-off part ΔS. The passed part LPF{S} does not include high frequency components to be cut-off at the LPF 104, while the cut-off part ΔS includes the high frequency components. According to FIG. 6, there is another expression of the source signal S. The first quadrature modulator 108 should reconstruct the source signal S from the output signal from the DAC 206 and the output signal ΔS' from the second quadrature modulator 210. This fact leads to the following equation.

$$S = LPF\{S\} \cdot \Delta S'. \quad (11)$$

where ΔS' is an unknown factor to be deviated. Based on the equations (10) and (11), ΔS' may be expressed using the source signal S, the output signal from the LPF 104, and the difference signal between the source signal S and the output signal from the LPF 104, ΔS, as follows:

$$\Delta S' = \frac{LPF\{S\} + \Delta S}{LPF\{S\}} = 1 + \frac{\Delta S}{LPF\{S\}}. \quad (12)$$

This equation (12) is nothing else but the equation (9). Therefore there is may no any parasitic AM in the HAP1 and HAP2 inputs, and thereby it may be possible to reconstruct the original signal S after combining perfectly. Further, the passed part LPF{S} may have narrower spectrum than the source signal S. Hence, when the passed part LPF{S} passes through components of the high frequency circuit, such as DAC 206, it is possible to prevent parasitic amplitude modulation from occurring.

(Detailed Description of the Depicted Embodiment)

Figure 7:
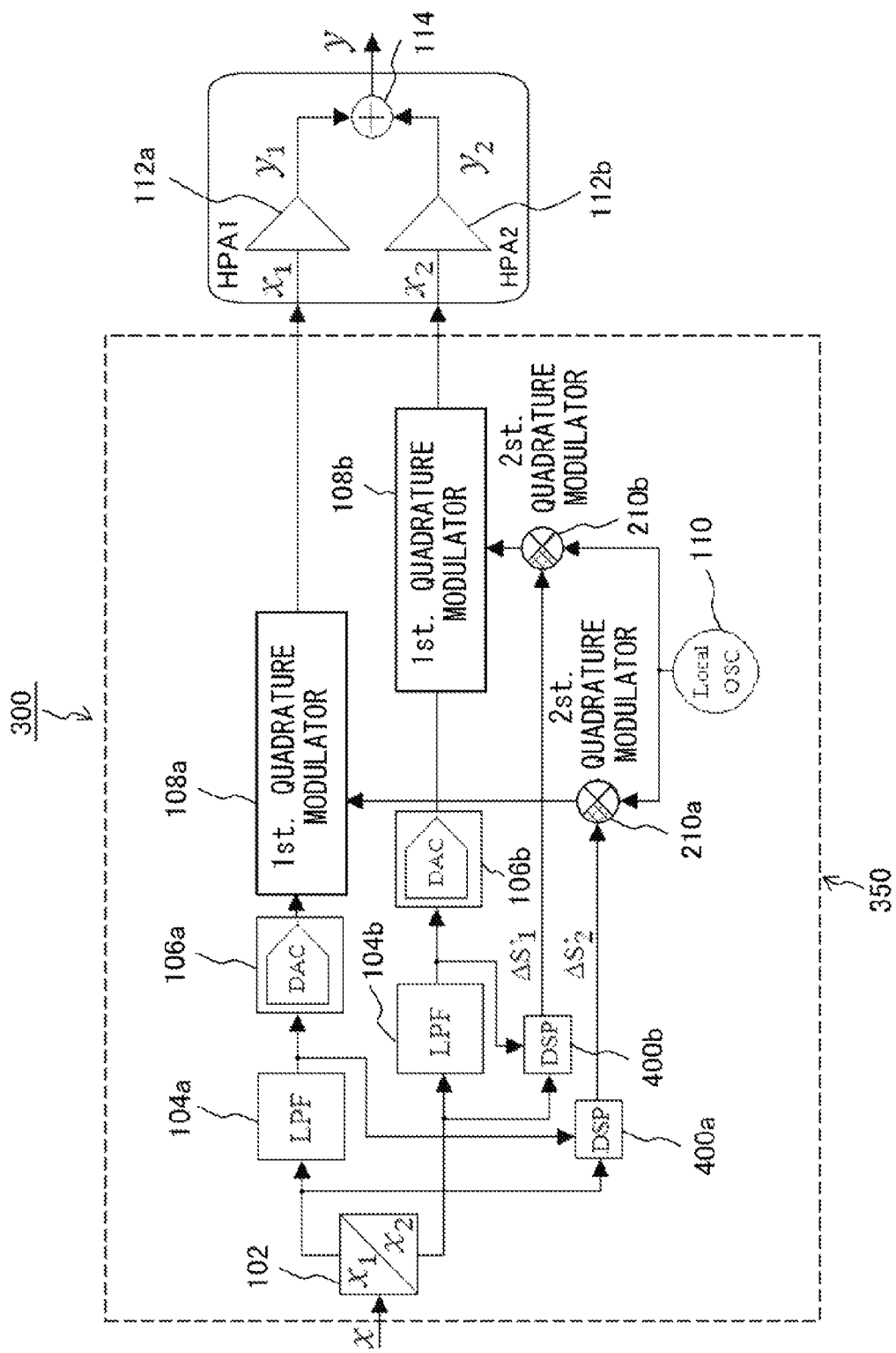
FIG. 7 is a functional diagram illustrating a narrowband linear LINC modulator according to an embodiment of the present invention.
Figure 8:
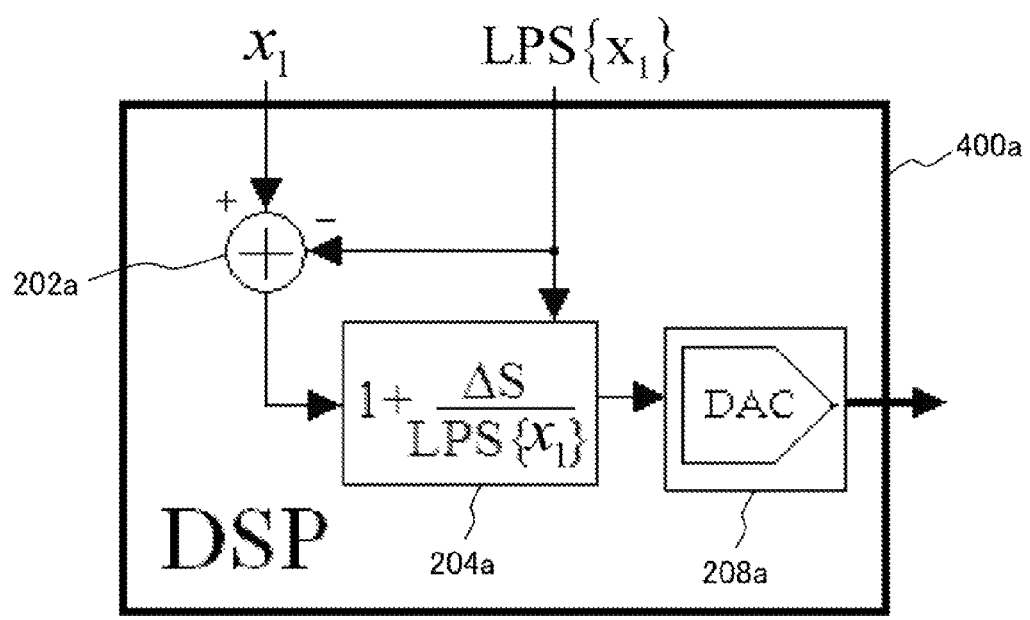
FIG. 8 is a functional diagram illustrating the digital signal processor (DSP) block internal structure for the narrowband linear LINC modulator according to the embodiment of the present invention.

Referring to FIGS. 7-9, example of a composite High Power Amplifier (C-HPA) 300 including a LINC modulator 350 will be explained.

The LINC modulator may use a narrowband circuit in a composite high amplifier arm, e.g., digital-to-analog convertor (DAC) with low clock frequencies to remove parasitic amplitude modulation automatically, thereby reconstructing a signal inputted into the modulator at an output terminal of the LINC modulator.

FIG. 7 is a functional diagram illustrating the amplifier 300 including the LINC modulator 350. The LINC modulator 350 may be prevented from causing an unwanted parasitic amplitude modulation since only narrowband signals may be passed through each arm of the LINC modulator 350.

In this embodiment, as discussed referring to the comparative example, the SCS 102 generates two constant-envelope signals, i.e., a first constant-envelope signal $x_1(t)$ and a second constant-envelope signal $x_2(t)$ using a source signal x(t). The first and second constant-envelope signals x1(t) and x2(t) travel through different paths with each other to enter the high power amplifiers 112a (HPA$_1$) and 112b (HPA$_2$), respectively.

As illustrated in FIG. 7, the amplifier 300 having the LINC modulator 350 is configured to have two arms for the LINC modulator 350 for the amplifier 300. The signal component separator (SCS) 102, the LPF 104a, the DAC 106a, the first quadratic modulator (or sometimes referred to as the quadrature modulator for simplicity) 108a, a DSP 400a, a second quadratic modulator 210a, and the local oscillator 110 constitute one of the arms of the LINC modulator 350 for the C-HPA 300. The LPF 104a, the DAC 106a, the first quadratic modulator 108a, the second quadratic modulator 210a have similar or the same functions with the LPF 104, the DAC 106, the first quadratic modulator 108, the second quadratic modulator 210 illustrated in FIG. 6. In the similar way, The SCS 102, the LPF 104b, the DAC 106b, the first quadratic modulator 108b, a DSP 400b, a second quadratic modulator 210b, and the local oscillator 110 constitute another of the arms, namely a second arm for the C-HPA 300. It would be preferable that the first and second arms have the same configuration and/or the function.

The C-HPA 300 is constituted of the LINC modulator 350, the high power amplifiers 112a (HPA1) and 112b (HPA2), and combiner 114.

A source signal x(t) is separated into two parts, a first constant-envelope signal x1(t) and a second constant-envelope signal x2(t) at the signal component separator (SCS) 102. Each of these two constant-envelope signals x1(t) and x2(t) is further separated into two parts, i.e., low-frequency parts LPF{x1} and LPF{x2} and high frequency parts ΔS1, ΔS2. The low-frequency part LPF{x1} is inputted into the DAC 106a and DSP 400a. In the similar way, the low-frequency part LPF{x2} is inputted into the DAC 106b and DSP 400b. While an output signal of the DAC 106a is inputted into the quadrature modulation unit 108a, an output signal of the DSP 400b is inputted into the quadrature modulation unit 108a after passing through the quadrature modulation unit 210a at which the output signal of the DSP 400b and an output signal of the local oscillator 110 are combined.

The high frequency parts for individual arms ΔS1 and ΔS2 are generated as the difference (the error) between the original signals in the arm S and the signals with frequency restriction at the LPF 104a and 104b at subtractors 202a and 202b in the DSP 400a and 400b:

$$\Delta S_1 = x_1 - LPF\{x_1\} \quad (13)$$

$$\Delta S_2 = x_2 - LPF\{x_2\} \quad (14)$$

where LPF{x1} and LPF{x2} represent frequency components which are passed through the LPF 104a and 104b, respectively.

FIG. 8 is a functional diagram illustrating the digital signal processor (DSP) block internal structure for the narrowband linear LINC modulator 300 according to the embodiment of the present invention. The structure illustrated in FIG. 8 is applied to both the DSP 400a and 400b. The DSP 400a and 400b may be constructed as specific circuit for processing the above function, or may be a general processor that may processes commands and/or instructions included in a software program to be stored in a not-illustrated memory device. The DSP 400a includes the subtractor 202a, a processor 204a, and a DAC 208a. The DSP 400b includes the subtractor 202b, a processor 204b, and a DAC 208b. The DSP 400a receives the output signals of the SCS 102 and the LPF 104a and outputs a signal ΔS1':

$$\Delta S_1' = \frac{LPF\{x_1\} + \Delta S_1}{LPF\{x_1\}} = 1 + \frac{\Delta S_1}{LPF\{x_1\}}. \quad (15)$$

As mentioned above, after the signal ΔS1' is converted into an analog signal at the DAC 208a, the analog signal ΔS1' is inputted into the quadratic modulator 210a. Because of the high-frequency nature of the signal distortion, the DAC 208a for such signals must provide the high bandwidth, i.e. its clock must be high enough. However because of the low bit resolution requirements for the DAC 208a, it may not cause a serious problem. Thus low-cost hi-speed and low-resolution DAC 208a may be used for such purpose.

The second quadrature modulator 210a may have the similar or same function with the first quadrature modulators 108a, 108b in FIG. 1. Each of the second quadrature modulators 210a, 210b include mixer for up-converting frequencies and mixing the output signal from the DAC 206 with the local oscillation signal from the local oscillator 110. After mixing, the second quadrature modulators 210a, 210b up-convert the output signal from the DAC 206 to predetermined frequency and output a resulting signal toward the first quadrature modulator 108. At the first quadrature modulators 108a, 108b, the source signal S(t) may be reconstructed perfectly because the equation (11) is effective.

The DAC 400b has the similar or the same functions with the DAC 400a, and the prefect reconstruction mechanism explained with referring to FIG. 6 is also functioned in the second arm of the amplifier 300 having the LINC modulator 350.

Although the detailed configuration of the DSP 400b is not illustrated in the drawings, a signal ΔS2':

$$\Delta S_2' = \frac{LPF\{x_2\} + \Delta S_2}{LPF\{x_2\}} = 1 + \frac{\Delta S_2}{LPF\{x_2\}}.$$

is generated based on the output signals of the SCS 102 and the LPF 104b at the DSP 400b. After the signal ΔS2' is converted into an analog signal at the DAC 208b, the analog signal ΔS2' is inputted in to the second quadrature modulator 210b.

The output signals from the first quadrature modulators 108a and 108b are amplified by high-power amplifiers 112a and 112b (HAP1 and HPA2) to generate amplified arm signals y1(t) and y2(t), respectively. These two signals y1(t) and y2(t) are then combined at the adder 114 to yield a amplified signal y(t).

Due to such a configuration of the LINC modulator 350 of the C-HPA 300, input signals to the HPA1 112a and HPA2 112b are reconstructed to be the first constant-envelope signal x1(t) and the second constant-envelope signal x2(t). The narrowband linear LINC modulator 300 automatically removes the parasitic amplitude modulation (AM) at the input terminals of the HPA1 112a and the HPA2 112b. Thus it allows using a narrowband circuits in the C-HPA arms, i.e. DAC 208a, 208b with low clock frequencies. Therefore there are no inter-modulation distortions in the HPAs output signal spectrum. Additionally because the underlying theory is the exact solution, the perfect reconstruction of the transmitted signal may be obtained. So, the unwanted factor:

$$G_1(|x_1(t)|) - G_2(|x_1(t)|)$$

in the right hand side of the equation (7) may be reduced surely, and the perfect signal reconstruction after combining signals passed through LPFs become possible.

Further, according to such a configuration of the amplifier 300 having the LINC modulator 350, the method for amplifying the source signal may be functioned. The method for amplifying a source signal (x(t)) includes: separating the source signal x(t) to generates a plurality of constant envelope signals (x1(t), x2(t)) by the SCS 102; comparing frequencies of components of the plurality of constant envelope signals (x1(t), x2(t)=S2(t)) with a threshold frequency to generate first signals (LPF{S1(t)}, LPF{S2(t)}) including a first frequency part of the input signal, the first frequency part being composed of frequencies lower than a predetermined frequency and second signals (ΔS1, ΔS2) including a second frequency part of the input signal whose frequencies are different from the first frequency part of the first signal (LPF{x1(t)}, LPF{x2(t)}) using the LPF 104a, 104b; performing frequency signal distortion of the second signals (ΔS1, ΔS2) to generate distorted signals (1+ΔS1/LPF{x1}, 1+ΔS2/LPF{x2}), the frequency signal distortion being defined using the first signal (LPF{x1(t)}, LPF{x2(t)}) and the second signal (ΔS1, ΔS2) using the DSPs 400a, 400b; and multiplying the first signal (LPF{x1(t)}, LPF{x2(t)}) and the distorted signal (1+ΔS1/LPF{x1}, 1+ΔS2/LPF{x2}) to reconstruct the constant envelope signals (x1(t), x2(t)); amplifying the constant envelope signals (x1(t), x2(t)) to generate amplified arm signals (y1(t), y2(t)) using the high power amplifiers 112a (HPA1), 112b (HPA2); and adding all of the amplified signals to yield an amplified signal (y(t)) by the adder 114. It should be noticed that this method include a method for reconstructing the input signal to the HPA after the input signal to be passed through a device having a limited bandwidth, such as LPF.

Therefore, no parasitic amplitude modulation may be occurred while the first signal (LPF{S1(t)}, LPF{S2(t)}) is passing through components of high frequency circuits, e.g., the LPF 104a, 104b, the DSPs 400a, 400b. Further, the constant envelope signals (x1(t), x2(t)) may be reconstructed at the output terminals of the modulator.

FIG. 9 is a diagram illustrating the spectrum of the C-HPA output signal y(t) for the narrowband linear LINC modulator for LPFs in the arms with passband 20 MHz, 40 MHz and 60 MHz.

As may be seen from FIG. 9, the proposed approach provides 100% out-of-band spectrum suppression. The signal spectrum at the C-HPA output is the same as the spectrum of the transmitted signal x (plot in FIG. 9 is denoted NO HPA NO LPF). Thus the level of out-of-band spectrum at the proposed narrowband linear LINC HPA is less than −90 dB.

Therefore, the modulator, for example a LINC modulator, may be obtained. The modulator may use a narrowband circuit in a composite high amplifier arm, e.g., digital-to-analog convertor (DAC) with low clock frequencies to remove parasitic amplitude modulation automatically, thereby reconstructing a signal inputted into the modulator at an output terminal of the LINC modulator.

It should be noted that, although only the composite high power amplifier having two arms have been described, a ordinary skilled person may generalize the example given in the specification to multiple arms straightforwardly.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made thereto without departing from the spirit and scope of the invention.

What is claimed is:

1. A linear amplification with nonlinear components (LINC) modulator, comprising:
    a separator that generates a plurality of constant envelope signals from a source signal;
    a plurality of arms through which the plurality of the constant envelope signals are passed, each arm comprising;
        a filter that compares frequencies of components of the constant envelope signals with a threshold frequency to generate a first signal including a first frequency part of the source signal, the first frequency part being composed of frequencies lower than a predetermined frequency;
        a processor that generates a second signal including a second frequency part of the source signal whose frequencies are different from the first frequency part of the first signal and performs a frequency signal distortion of the second signal to generate a distorted signal, the frequency signal distortion being defined using the first signal and the second signal; and
    a quadrature modulator that multiplies the first signal and the distorted signal to reconstruct the constant envelope signals.

2. The LINC modulator according to claim 1, wherein the processor has a bandwidth less than that of the constant envelope signals.

3. The LINC modulator according to claim 1, wherein the frequency signal distortion is given by an equation: 1+{ΔS/LPF{x}}, where let x be the source signal, LPF{x} be the first signal, and ΔS be the difference defined as x−LPF{x}.

4. The LINC modulator according to claim 1, wherein the constant envelope signals is passed through a low-pass filter to generate the first signal.

5. The LINC modulator according to claim 1, the each arm further comprising:
    a first digital-to-analog convertor that is passed by the first signal after being outputted from the separator and before inputting the first quadrature modulator, the first digital-to-analog converter having a first characteristic operation speed and a first resolution characteristic;
    a second digital-to-analog convertor that is passed by the distorted signal after being outputted from the separator and before inputting the first quadrature modulator, the second digital-to-analog converter having a second characteristic operation speed which is faster than the first characteristic operation speed and a second resolution characteristic which is lower than the first resolution characteristic.

6. An amplifier, comprising
    a separator that generates a plurality of constant envelope signals from a source signal;
    a plurality of arms, each of the plurality of the arms being passed by a corresponding one of the plurality of the constant envelope signals to output a corresponding one of a plurality of source signals, each of the plurality of the arms comprising:
- a filter that compares frequencies of components of the constant envelope signals with a threshold frequency to generate a first signal including a first frequency part of the source signal, the first frequency part being composed of frequencies higher than and/or equal to a predetermined frequency and a second signal including a second frequency part of the source signal whose frequencies are different from the first frequency part of the first signal;
- a processor that performs a frequency signal distortion of the second signal to generate a distorted signal, the frequency signal distortion being defined using the first signal and the second signal; and
- a quadrature modulator that multiplies the first signal and the distorted signal to reconstruct the constant envelope signals;

a plurality of power amplifier, each of the plurality of the power amplifier amplifying a corresponding one of the constant envelope signals to generate a amplified arm signal; and an adder that add all of the amplified signals to yield an amplified signal.

7. The amplifier according to claim 6, wherein the processor has a bandwidth less than that of the constant envelope signals.

8. The amplifier according to claim 6, wherein the frequency signal distortion is given by an equation: $1+\{\Delta S/LPF\{x\}\}$, where let x be the source signal, $LPF\{S\}$ be the first signal, and $\Delta S$ be the difference defined as $S-LPF\{x\}$.

9. The amplifier according to claim 6, wherein the constant envelope signals is passed through a low-pass filter to generate the first signal.

10. The amplifier according to claim 7, further comprising:
- a first digital-to-analog convertor that is passed by the first signal after being outputted from the separator and before inputting the multiplier, the first digital-to-analog converter having a first characteristic operation speed and a first resolution characteristic; and
- a second digital-to-analog convertor that is passed by the distorted signal after being outputted from the separator and before inputting the multiplier, the second digital-to-analog converter having a second characteristic operation speed which is faster than the first characteristic operation speed and a second resolution characteristic which is lower than the first resolution characteristic.

11. A method for amplifying a source signal, comprising:
separating the source signal x(t) to generates a plurality of constant envelope signals;

comparing frequencies of components of the plurality of constant envelope signals with a threshold frequency to generate first signals, each of the first signals including a first frequency part of the source signal, the first frequency part being composed of frequencies lower than a predetermined frequency, and second signals, each of the second signals including a second frequency part of the source signal whose frequencies are different from the first frequency part of a corresponding one of the first signals;

performing frequency signal distortion of the second signals to generate distorted signals, the frequency signal distortion being defined using one of the first signals and a corresponding one of the second signals; and multiplying the the first signal and the distorted signal to reconstruct the constant envelope signals;

amplifying the constant envelope signals to generate amplified arm signals; and adding all of the amplified signals to yield an amplified signal.

12. The method according to claim 11, wherein the processor has a bandwidth less than that of the source signal.

13. The method according to claim 11, wherein the frequency signal distortion is given by an equation: $1+\{\Delta S/LPF\{x\}\}$, where let S be the source signal, $LPF\{S\}$ be the first signal, and $\Delta S$ be the difference defined as $S-LPF\{S\}$.

14. The method according to claim 11, wherein the constant envelope signals is passed through a low-pass filter to generate the first signal.

15. The method according to claim 11, further comprising:
- converting the first signal from a digital to analog signal after separating the source signal x(t) and before multiplying the first signal by a first digital-to-analog convertor having a first characteristic operation speed and a first resolution characteristic;
- converting the first signal from a digital to analog signal after separating the source signal and before multiplying the first signal by a second digital-to-analog convertor having a second characteristic operation speed which is faster than the first characteristic operation speed and a second resolution characteristic which is lower than the first resolution characteristic.

* * * * *